(12) United States Patent
Reusser et al.

(10) Patent No.: US 9,076,633 B2
(45) Date of Patent: Jul. 7, 2015

(54) ELECTRON-BEAM DEVICE

(75) Inventors: Hans Reusser, Mamishaus (CH); Toni Waber, Aefligen (CH)

(73) Assignee: TETRA LAVAL HOLDINGS & FINANCE S.A., Pully (CH)

( * ) Notice: Subject to any disclaimer, the term of this patent is extended or adjusted under 35 U.S.C. 154(b) by 0 days.

(21) Appl. No.: 14/126,004

(22) PCT Filed: Jun. 27, 2012

(86) PCT No.: PCT/EP2012/062451
§ 371 (c)(1),
(2), (4) Date: Dec. 13, 2013

(87) PCT Pub. No.: WO2013/004563
PCT Pub. Date: Jan. 10, 2013

(65) Prior Publication Data
US 2014/0117838 A1    May 1, 2014

Related U.S. Application Data

(60) Provisional application No. 61/525,118, filed on Aug. 18, 2011.

(30) Foreign Application Priority Data

Jul. 4, 2011    (SE) ...................................... 1100517

(51) Int. Cl.
*H01J 37/30*    (2006.01)
*G21K 5/02*    (2006.01)

(52) U.S. Cl.
CPC ............... *H01J 37/3002* (2013.01); *G21K 5/02* (2013.01)

(58) Field of Classification Search
CPC .................. H01J 37/3002; H01J 37/30; H01J 37/06–37/153; H01J 35/00–35/18; H01J 35/32; H01J 2235/081; H01J 2235/087; H01J 2235/18; H01J 9/04; H01J 1/88; H01J 3/027; H01J 3/38; H01J 5/18; G21K 5/02; G21K 5/00; G21K 5/04; A61L 2/082; A61L 12/06; A61L 2/0041; A61L 2/087
USPC .......................................... 313/553–554, 420
See application file for complete search history.

(56) References Cited

U.S. PATENT DOCUMENTS

| | | | |
|---|---|---|---|
| 3,144,552 A | | 8/1964 | Schonberg et al. |
| 3,440,466 A | * | 4/1969 | Colvin et al. ................... 313/35 |
| 3,702,412 A | | 11/1972 | Quintal |
| 3,769,600 A | | 10/1973 | Denholm et al. |

(Continued)

FOREIGN PATENT DOCUMENTS

| | | |
|---|---|---|
| GB | 1 356 861 A | 6/1974 |
| WO | WO 2010/040454 A1 | 4/2010 |

OTHER PUBLICATIONS

International Search Report (PCT/ISA/210) mailed on Oct. 8, 2012, by the European Patent Office as the International Searching Authority for International Application No. PCT/EP2012/062451.

*Primary Examiner* — Anne Hines
*Assistant Examiner* — Jose M Diaz
(74) *Attorney, Agent, or Firm* — Buchanan Ingersoll & Rooney PC

(57) ABSTRACT

In order to improve the performance of an electron-beam device, the ends of the cathode housing is provided with dome-shaped structures.

6 Claims, 2 Drawing Sheets

(56) References Cited

U.S. PATENT DOCUMENTS

| | | | |
|---|---|---|---|
| 3,863,163 A | 1/1975 | Farrell et al. | |
| 4,008,413 A | 2/1977 | Bayless | |
| 4,379,977 A * | 4/1983 | Carmel et al. | 378/136 |
| 4,407,713 A * | 10/1983 | Zega | 204/298.22 |
| 2004/0202282 A1 * | 10/2004 | Miller | 378/140 |
| 2005/0225224 A1 | 10/2005 | Dally et al. | |
| 2011/0198513 A1 | 8/2011 | Holm | |
| 2014/0117259 A1 * | 5/2014 | Holm et al. | 250/492.3 |

\* cited by examiner

ELECTRON-BEAM DEVICE

TECHNICAL FIELD

The present invention relates to the field of electron beam devices, and in particular to electron beam devices utilized for sterilization of surfaces.

TECHNICAL BACKGROUND

Electron-beam devices (EBD in the following) may be used in many different fields. They may be characterized in the energy of the emitted electrons, which in turn is coupled to their intended use, such as the ones used for curing of paint or sterilization of surfaces. The present invention mainly relates to an EBD which may be used for sterilization purposes, in which the energy of the emitted electrons resides in an interval of about 50-300 keV. This should not, however, be construed as limiting, since there may be adequate applications for the present invention outside said interval too. Within the field of EBD:s used for sterilization, there are several different types, differing in size and shape, again depending on the intended use. The present invention is mainly directed towards an EBD which may be used for sterilization of a surface, or rather a web of material, and it therefore may have an elongate body and a likewise elongate cathode housing inside the elongate body. Again, the present invention should not be limited to the exact shape mentioned here, since it may also be applied to other EBD:s.

An electron gun incorporating the features according to the above description is disclosed in U.S. Pat. No. 3,863,163 to Farrell et al. Individual components of EBD:s are well described in the literature, and upon reading the present application the skilled person should have little or no problem in practising the present invention.

SUMMARY

The present invention relates to a sealed electron-beam device comprising an elongate body with an exit window, an elongate cathode housing with a proximal end and a distal end arranged inside the elongate body. One or more filaments are arranged inside the cathode housing, extending from the proximal end to the distal end, and the cathode housing further comprises one or more openings facing towards the exit window. The opening or openings are configured for passage of electrons generated by the filament to the exit window. The electron-beam device is characterized in that at least the distal end comprises a dome-shaped cap for covering components arranged in the end and for minimizing high field strengths.

The arrangement of the filaments may necessitate that the distal end of the cathode housing comprises coupling components for electrical coupling and mechanical suspension of the filaments. Covering this and other components of the cathode housing with a dome-shaped cap will provide a smooth surface, which reduces the tendency of high-field strengths (and thus arcs) being formed. In embodiments where the cathode housing itself is not suspended in one of its ends, the dome-shaped cap may be arranged in both ends of the cathode housing.

The dome-shaped cap preferable has rotational symmetry, and the free edge is preferably bent inwards with a radius to form a smooth outer profile, which further reduces the risk of any anomaly being generated. In an alternative embodiment the free edge is provided with a solid or hollow bulge or bead.

The cathode housing may in one or more embodiments comprise a semi-annular shell extending from the proximal end to the distal end, wherein the free edges of the semi-annular shell are bent inwards with a radius, thus forming a curved shape. Extending the semi-annular shell between the proximal end and the distal end gives the cathode housing a semi-cylindrical overall shape, as will be shown in relation to the detailed description and the drawings referred to therein. This shaping of the free edges will also reduce the tendency of high electrical field strengths being generated along the edges, and it consequently is beneficial for the generation of a controllable and predictable beam profile.

The cathode housing is preferably dimensioned such that at least its distal end may be inserted into the opening of the corresponding dome-shaped cap. In one or more embodiments the curvature of the cathode housing follows a radius being similar or slightly smaller than the radius of the opening in the open end of the dome-shaped cap.

According to one or more embodiments the opening or openings of the cathode housing may be provided by a control grid, which may be configured to assume a variable electrical potential in order to control emission of electrons through the exit window. The control grid basically covers the area between the free edges of the cathode housing, which is not covered by any other components. In one or more embodiments the curved shape earlier described as being provided by the free edges (longitudinal) of the cathode housing is instead provided by the longitudinal free edges of the control grid. Both embodiments will be described in the detailed description.

In one or more embodiments one or more filaments extend in the longitudinal direction of the cathode housing, wherein the components arranged in the distal end comprises an electrical filament connection and a filament suspension.

In one or more embodiments both the distal and the proximal end of the cathode housing are free ends comprising the dome-shaped cap, and in other embodiments only the distal end is free, while the proximal end is connected to one end of the elongate body using a suitable suspension arrangement. In embodiments including the latter construction the proximal end may comprise also comprise cap having a curved shape with rotational symmetry, yet while the distal end of the dome-shape cap (the end facing towards the distal end of the elongate body) is smoothly curved the proximal end of the proximal end of this proximal cap (the end facing towards the proximal end of the elongate body) has an essentially cylindrical configuration configured to have a mating fit to an element of the suspension arrangement. This element of the suspension arrangement has an essentially cylindrical shape at the end which has a mating fit with the proximal cap, while the remote end has a gradually decreasing diameter, which may preferably follow a smooth curve. The smooth curve meets a cylindrical structure or stem forming a part of the element, which effectively suspends the entire cathode arrangement in the elongate body.

DETAILED DESCRIPTION

Figure 1:
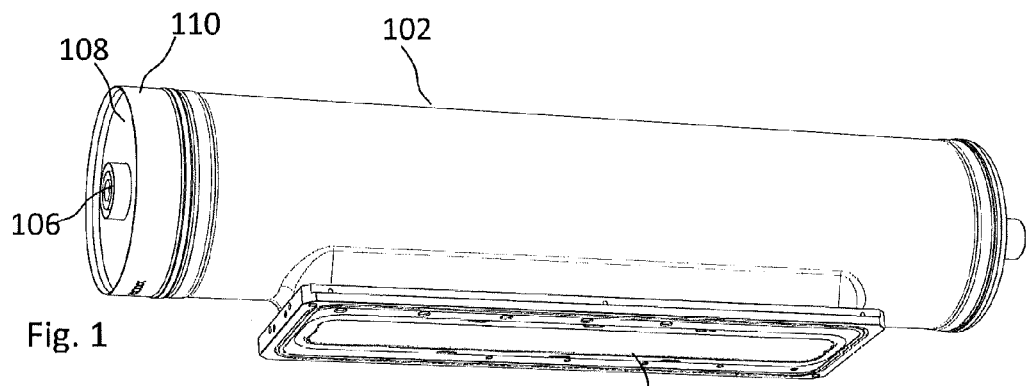
FIG. 1 is a perspective view of an electron-beam device according to one embodiment of the present invention.

FIG. 1 is a perspective view of an electron beam device according to a first embodiment of the present invention, showing only the exterior thereof. The main component of the EBD is the elongate body 102, which is essentially tubular. An exit window arrangement 104 provides an outlet for electrons from the vacuum inside the elongate body 102. The exit window arrangement 104 in turn comprises subassemblies not relevant for the present invention, yet having the properties of providing an outlet window for electrons while preserving vacuum inside the tube body 102. A proximal end of the elongate body 102 comprises an assembly including electrical connections 106, and a ceramic disc 108 sealing towards the assembly and an inner perimeter of the elongate body 102. In the present embodiment the ceramic disc 108 actually seals towards the inner perimeter of a cylindrical component 110 which in turn is welded to the elongate body. For reasons not relevant for the present invention this arrangement simplifies assembly, disassembly, and reassembly of the EBD.

Figure 2:
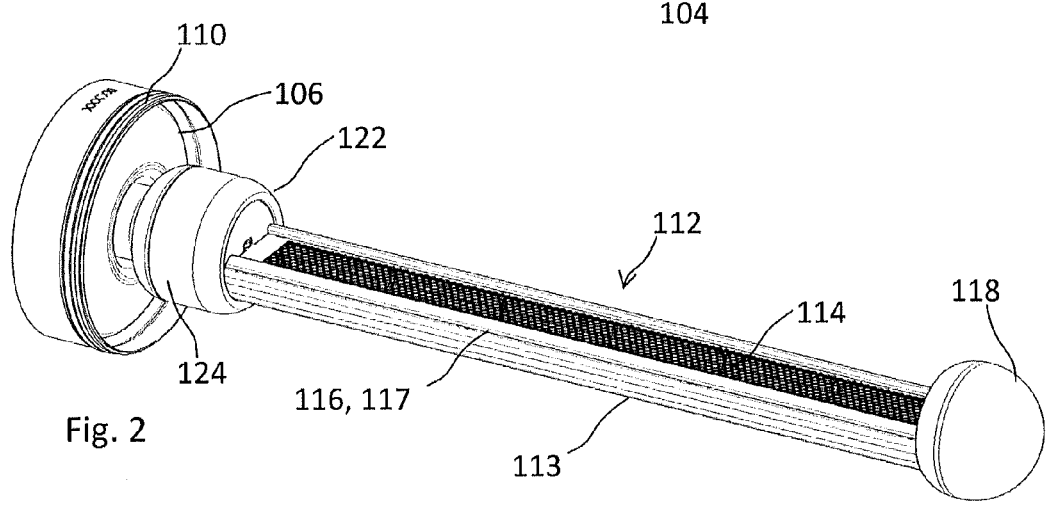
FIG. 2 is a perspective view of a cathode housing which may be used in the electron-beam device of FIG. 1.

Inside the elongate body 102 a cathode housing 112 is arranged, which is one of the components illustrated in FIG. 2. Looking at FIG. 2 some details are identical to details shown in FIG. 1, which should simplify understanding. The cylindrical body 110 and the ceramic disc 108 are clearly visible, and the skilled person realizes how the illustrated arrangement may be inserted in an elongate body 102 for forming the assembly of FIG. 1. The actual cathode housing 112 comprises a semi-annular shell 113, the open side of which is covered by a control grid 114. Inside the annular shell one or more filaments (see FIG. 3) are arranged, extending from a proximal end of the cathode housing 112 to a distal end thereof. Electron generated by the filament may be accelerated towards the exit window 104, which is common practice for most EBD:s. By applying an electrical potential to the control grid 114 the emission of electrons may be further controlled. The control grid 114, i.e. the open side of the cathode housing 112 should for obvious reasons be facing the exit window arrangement 104. The control grid 114 comprises several openings or through-holes for passage of electrons.

The free edges 116 of the semi-annular shell 113 of the cathode housing 112 are preferably bent inwards or 'curled', for formation of smooth bulges or beads. As an alternative to being curled the free edges of the semi-annular shell may be provided with solid or hollow bulges, provided as a separate part or formed in one piece with the rest of the shell.

The proximal end as well as the distal end of the cathode housing 112 comprises electrical connections as well as physical suspensions for the filament 120. At the distal end this arrangement is housed inside or covered with a dome-shaped cap 118. The application of the dome-shaped cap will in an effective manner shield the components inside the cap from the electrical field outside the cap, and vice versa, e.g. implying that the shape of the components inside the cap will not be able to affect the electrical field in a detrimental way.

Figure 3:
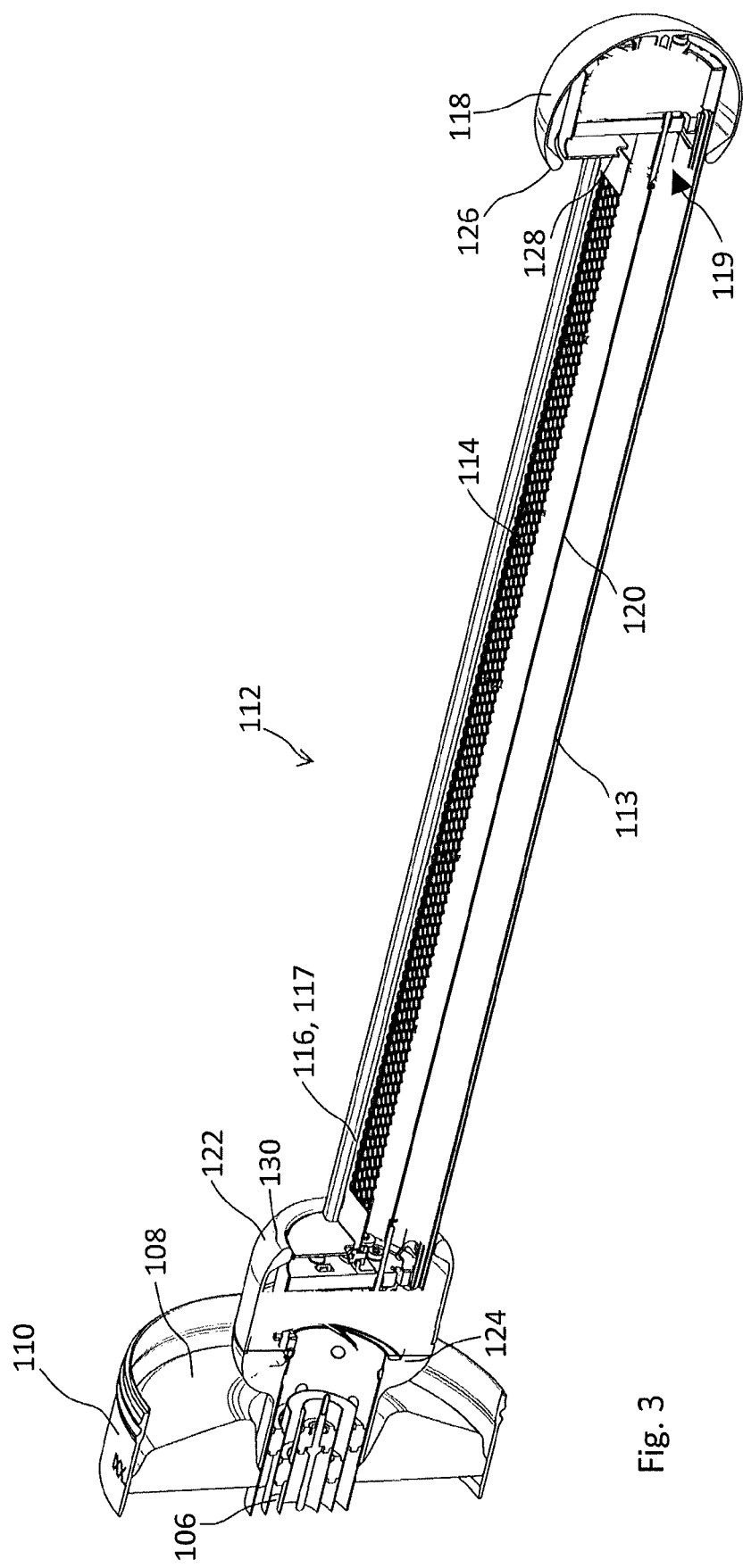
FIG. 3 is a longitudinal section of the cathode housing of FIG. 2.

The cap 118 has the form of a spherical shell with part of the shell cutaway such that it comprises slightly more than a semi-sphere, which is illustrated in FIG. 3. The cap 118 of the present embodiment is axisymmetric and the free end is provided with a solid bulge 126, which gives the free edge a smooth appearance too. An opening 119 opening of the cap 118, as defined by the inner perimeter of the bulge 126 is dimensioned to fit over the semi-annular shell 113 of the cathode housing 112, such that a portion of the housing may be inserted therein. The opening of the cap 118 has the same diameter as the curvature of the semi-annular shell 113, effectively closing a lower half of the opening. From this relationship it is obvious that an outer diameter of the cap 118 is larger than the corresponding dimension of the semi-annular shell, since the latter is insertable in an opening having a diameter smaller than the outer diameter of the cap 118. The upper half of the opening may be covered by a plate 128, preventive the electrical field from entering the cap 118, and positioning the cathode housing 112 in relation to the cap 118. The cap 118 may be said to comprise an open end (where the free edge and the bead are situated) and a semi-sphere, formed in one piece.

The cap 118 may be manufactured in several ways and from several materials. Examples include a cap 118 made from stainless steel or nickel, which is formed from a solid piece of material machined on a lathe. Another alternative may be to deep-draw two pieces of sheet material and weld them together.

At its proximal end the cathode housing 112 is suspended to the elongate body. This suspension may be provided in more than one way, and the suspension best seen in FIG. 3 is one option not previously shown. The cathode housing is effectively suspended in a central opening of the disc 108, with some intermediate components not discussed in detail in the present specification. To avoid distortion of the electrical field in the proximal end it is provided with a cap too, which will be referred to as 'the proximal cap' 122 in the following. The free edge at the open end of the proximal cap 122 is provided with a bead 130, and the open end as such is essentially identical to the corresponding end of the cap 118. However, while the cap 118 was said to comprise the open end and a semi-sphere, the proximal cap 122 comprises the open end and a cylindrical shell, such that it may fit over and to the suspension arrangement at the proximal end of the tube body. Remote to its open end the proximal cap 122 comprises a connection portion 124 of gradually reducing diameter connecting the cylindrical shell to the cylindrical disc 107. The mushroom shaped connection portion 124 also comprises the electronic connections 106. In the design of the connection portion 124 care has been taken to avoid sharp corners.

It should be noted that on a general level shapes may differ from "semi-annular" "spherical" or "semi-spherical" while remaining within the scope of the present invention as defined by the claims. "Upper half" and "lower half" should also be construed as a qualitative statement rather than a quantitative one, though for the embodiment shown it is close to a quantitative one.

In one embodiment (not shown) both ends of the cathode housing are free. In such an embodiment a dome-shaped cap 118 may preferably be arranged at both ends of the cathode housing.

Figure 4:
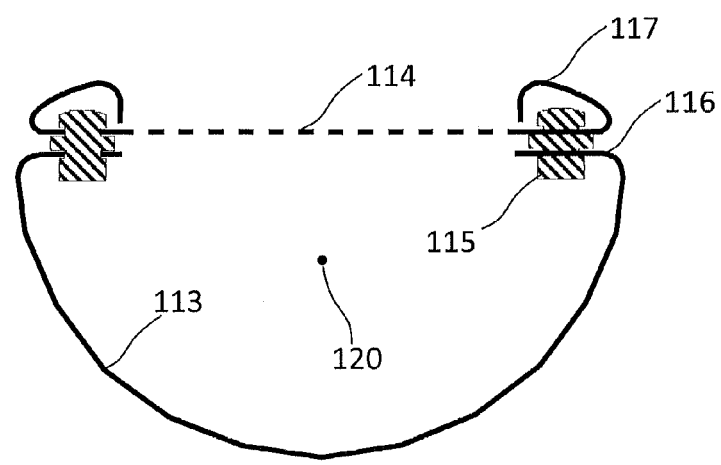
FIG. 4 is a schematic cross section of the cathode housing of FIG. 2.

In yet another embodiment the free longitudinal edges 116 of the cathode housing are bent inwards, towards a symmetry plane of the cathode housing 112, and the control grid 114 is attached to the free longitudinal edges in attachment points 117 which may function as electrical isolators, depending if there is a difference in electrical potential between the cathode housing and the grid, or not. The free longitudinal edges 117 of the control grid 114 is then bend in a bulge, or curled, over itself, and in particular over the attachment point(s) between the cathode housing 112 and the control grid 114. This is shown in some detail in the partial cross section of FIG. 4, and since the layout of FIG. 4 may be applied to the device of FIGS. 2 and 3 both reference numerals (116 and 117) have been used to identify the "same" component, a bulge which either is provided by the free edges of the cathode housing 112 or the free edges of the control grid 114. Either way the bulge 116, 117 will assist in the generation of a smooth predicable electrical field to the benefit of performance of the EBD.

The invention claimed is:

1. A sealed electron-beam device comprising an elongate body with an exit window, an elongate cathode housing with a proximal end and a distal end arranged inside the elongate body and one or more filaments arranged inside the cathode housing, the cathode housing further comprising one or more openings facing towards the exit window, the opening or openings being configured for passage of electrons generated by the filament to the exit window, wherein the elongate cathode housing comprises a semi-annular shell extending from the distal end to the proximal end, wherein the distal end of the cathode housing is inserted into an opening of a dome-shaped cap for covering components arranged in the distal end of the cathode housing and for minimizing high field strengths, a plate covering an upper part of the opening of the dome-shaped cap, the proximal end of the cathode housing extending into an opening of a proximal cap, a plate covering an upper part of the opening of the proximal cap, and longitudinal free edges of either the semi-annular shell of the cathode housing or the control grid are curled to form bulges, the bulges possessing ends pointing in a direction essentially perpendicular to a plane of the openings of the control grid.

2. The sealed electron-beam device of claim 1, wherein the dome-shaped cap comprises a semi-spherical portion and an end portion, the end portion having a free edge defining the opening of the dome-shaped cap.

3. The sealed electron-beam device of claim 2, wherein the free edge of the end portion of dome-shaped cap has a bulge.

4. The sealed electron-beam device of claim 1, wherein an outer diameter of the dome-shaped cap exceeds a corresponding dimension of the elongate cathode housing.

5. The sealed electron-beam device of claim 1, wherein the proximal cap has an end portion with a free edge defining the opening of the proximal cap, and a cylindrical portion.

6. The sealed electron-beam device of claim 5, wherein the free edge defining the opening of the proximal cap includes a bead.

* * * * *